United States Patent [19]

Schneider et al.

[11] Patent Number: 4,622,526
[45] Date of Patent: Nov. 11, 1986

[54] POWER LINE INTERFERENCE FILTER MOUNTED ON A PC BOARD

[75] Inventors: Lon M. Schneider, Arlington Heights; William R. Walters, McHenry, both of Ill.

[73] Assignee: Corcom, Inc., Libertyville, Ill.

[21] Appl. No.: 650,651

[22] Filed: Sep. 14, 1984

[51] Int. Cl.$^4$ ............................................. H03H 7/09
[52] U.S. Cl. ..................................... 333/181; 333/185
[58] Field of Search ................. 333/181, 185, 12, 167, 333/168, 172, 175, 140, 138, 161, 246; 361/401; 336/200; 339/143 R, 147 R, 147 P, 17 R

[56] References Cited

U.S. PATENT DOCUMENTS

| | | | |
|---|---|---|---|
| 3,644,848 | 2/1972 | Kruczek | 333/185 |
| 4,110,715 | 8/1978 | Reindel | 333/185 X |
| 4,342,013 | 7/1982 | Kallman | 333/181 |

FOREIGN PATENT DOCUMENTS 2446714 4/1976 Fed. Rep. of Germany ...... 333/181

OTHER PUBLICATIONS

Zack, Albert, "Wafer Coil Technique Mechanizes Production of Transformers" *Electronics,* Dec. 1954, pp. 234-240.

Primary Examiner—Eugene R. LaRoche
Assistant Examiner—Benny Lee
Attorney, Agent, or Firm—Hill, Van Santen, Steadman & Simpson

[57] ABSTRACT

A power line filter for removing interference is provided which is formed on a printed circuit board which has an extended grounding area and to which are mounted parallel capacitors, a pair of line inductors and a parallel resistor. Each of the inductors is formed as multi-section coils wound on plastic bobbins and which can be machine wound and the two wound inductors are then mounted on rectangular cores of U-U or U-I-shape to form the line inductors. At least two of the capacitors are rectangular shaped and are mounted on opposite ends of the line inductors and the assembled filter is placed into a case and encapsulated through openings formed in the printed circuit board.

5 Claims, 8 Drawing Figures

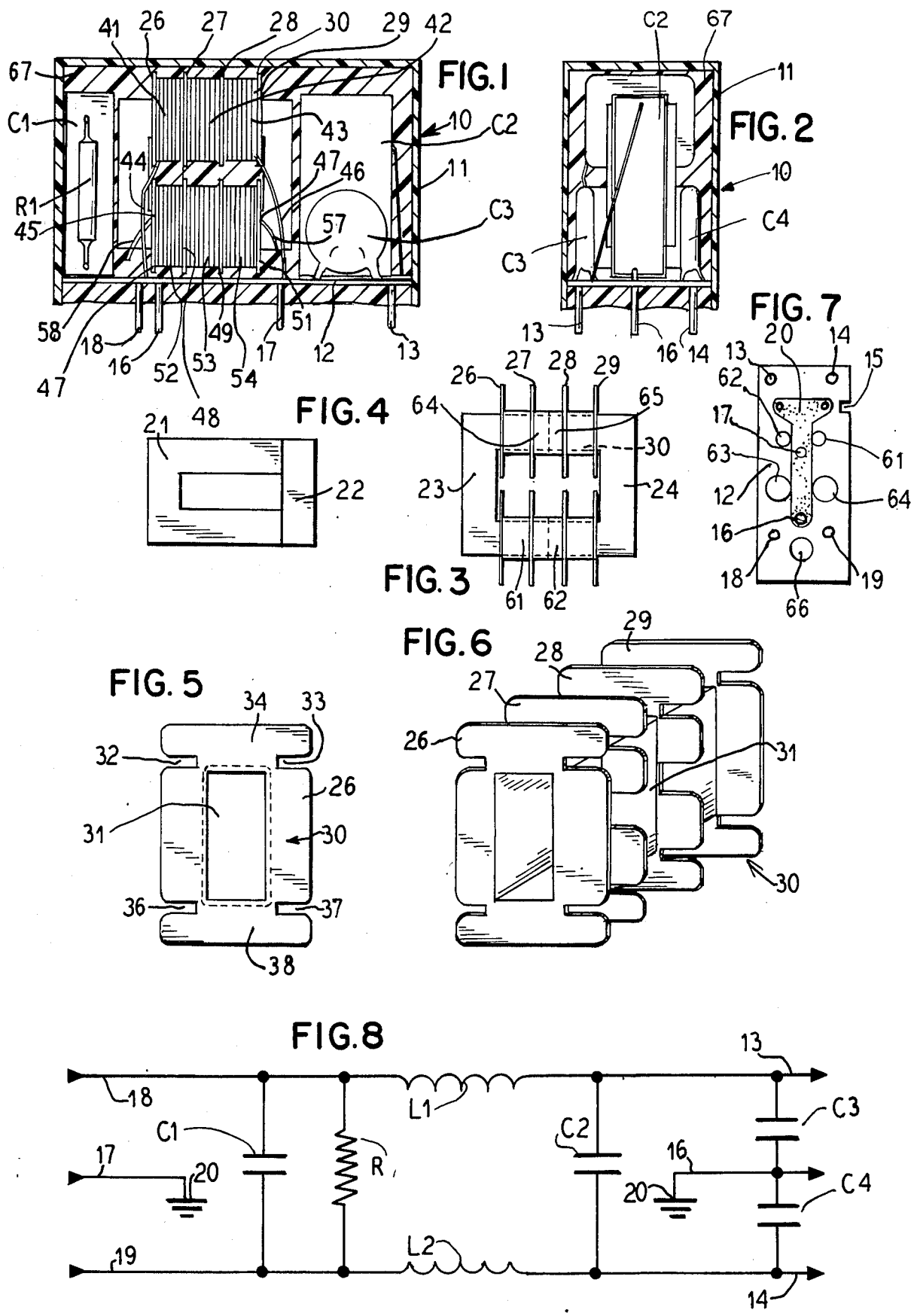

POWER LINE INTERFERENCE FILTER MOUNTED ON A PC BOARD

BACKGROUND OF THE INVENTION

1. Field of the Invention

This invention relates in general to filters and in particular to a novel series of line filters for removing interference from power line supplies and other sources.

2. Description of the Prior Art

Line filters are known in the art which use line inductors and shunt capacitors for filtering undesired interference from power supplies.

SUMMARY OF THE INVENTION

The present invention relates to a novel line filter which utilizes line inductors mounted on U-U or U-I core configurations and where each of the coils of the inductors is wound on a split bobbin such as a three section split bobbin so as to reduce the capacitance of the inductor and so that the inductor can be machine wound. After the coils are wound on the split bobbins, the wound bobbins are mounted on the rectangular cross-sectional cores and the cores are joined together by adhesive such as acrylic adhesives to form the assembled line inductors. The line inductors are mounted on a printed circuit board and four shunt capacitors and a shunt resistor are also mounted on the printed circuit board. The printed circuit board has an extended area which forms a ground plane and at least two grounding pins extend from the ground plane.

The unique power filter of the invention using the partitioned bobbins enables the coils to be wound in three compartments by a machine. This provides a much lower shunt capacity than that achieved with a solenoid structure and the ultimate filter is substantially improved in the frequency range of 1-30 Megahertz as far as rejection. level and insertion loss.

The transformer coil/core assembly utilizes U-U or U-I core configurations and these cores can be used in conjunction with split bobbins due to a unique gluing process wherein the core interfaces are so close that very low inductance loss occurs due to the close coupling.

The cores are rectangular shaped with results in high differential mode inductance.

The multiple section bobbin reduces the capacitance around the coil in the structure.

The various components are mounted on edge on the printed circuit board so as to minimize the mounting space required for the filter.

Inductance in the line to ground capacitor branches of the circuit is minimized through the use of unique three terminal capacitors. This results in extended high frequency performance. This performance is preserved at the interface to the printed circuit board to which the filter is attached, through the use of dual ground terminals.

Other objects, features and advantages of this invention will be readily apparent from the following description of certain preferred embodiments thereof, taken in conjunction with the accompanying drawings although variations and modifications may be effected without departing from the spirit and scope of the novel concepts of the disclosure and in which:

BRIEF DESCRIPTION OF THE DRAWINGS

FIG. 1 is a sectional view through the potted and completed filter;

FIG. 2 is a sectional view taken at right angles to the sectional view of FIG. 1;

FIG. 3 illustrates the construction of the inductors utilizing U-U shaped cores;

FIG. 4 illustrates a modification of the cores wherein U-I shaped cores are used;

FIG. 5 is an end plan view of the bobbin of the invention;

FIG. 6 is a perspective view of the bobbin of the invention;

FIG. 7 is a plan view of the printed circuit board used in the invention; and

FIG. 8 is an electrical schematic of the filter of the invention.

DESCRIPTION OF THE PREFERRED EMBODIMENTS

As illustrated in FIGS. 1 through 7, the invention includes a printed circuit board 12 particularly illustrated in plan view in FIG. 7 which is formed with potting openings 61, 62, 63, 64 and 66 to allow potting material to pass therethrough and is formed with a key notch 15 so as to align and index, a cover member 11 (FIG. 2) therewith. A conducting layer of solder 20 is formed on the printed circuit board 12 and forms a ground plane and a pair of grounding pins 16 and 17 are connected to the printed circuit board 12 and are electrically connected to layer of solder the as shown in FIG. 7 ground plane 20.

A pair of input pins 18 and 19 are mounted in the printed circuit board 12 adjacent one end and a pair of output pins 13 and 14 are mounted adjacent the other end of the printed circuit board. A shunt capacitor C1 is connected between the pins 18 and 19 and a parallel resistor R1 is connected across the input terminals 18 and 19. The capacitor C1 as illustrated in FIG. 1, is parallelepiped in shape and is end mounted so that it occupies a very small area of the printed circuit board 12. A pair of capacitors C3 and C4 are connected in series between the output terminals 13 and 14 and their junction point is connected to ground terminal 16. The capacitors C3 and C4 are generally disc-shaped and each have a grounding terminal on one side thereof which is connected to the layer of solder ground plane 20 and the ground lead 16. A capacitor C2 which is parallelepiped in shape is connected between the output terminals 13 and 14 and is mounted on the end of the printed circuit board 12 opposite to the capacitor C1 as illustrated in FIG. 1.

Between the capacitors C1 and C2 are mounted the inductors L1 and L2 which are formed as multi-section coils wound on partition bobbins. FIG. 5 is an end view of the bobbin 30 upon which the coil L1 is mounted. The bobbin 30 has a central rectangular portion formed with a rectangular opening 31 and has a plurality of partitions and in a particular example illustrated in FIGS. 1, 3 and 6 four partitions 26, 27, 28 and 29 are provided. The partition 26 is illustrated in FIG. 5 and has upper notches 32 and 33 and lower notches 36 and 37 which form upper portion 34 and lower portion 38. The other partition members are constructed like member 26. The winding L1 is wound on the bobbin 30 with three sections 41, 42 and 43 in series to form a single inductor. Input lead 44 is connected to input terminal 18 and the output lead 46 is connected to output terminal 13. Other styles of bobbins may also be used.

Inductor L2 is formed on a suitable bobbin 45 which has partitions 47, 48, 49 and 51 upon which winding segments 52, 53 and 54 are wound in series. Input lead 56 is connected to input pin 19 and the output lead 57 is connected to the output pin 14. The bobbins include mounting terminal pins. The bobbins 30 and 45 are mounted on a magnetic core either of the form illustrated in FIG. 3 or FIG. 4. The magnetic core of FIG. 3 comprises two U-shaped cores 23 and 24 which have their adjacent legs 61, 62, 64 and 65 connected together with a suitable adhesive as, for example, an acrylic adhesive. FIG. 4 illustrates a modified form of the core comprising a U-shaped core 21 and an I-shaped core 22 which are inserted through the bobbins 30 and 45 after which the members 21 and 22 are connected together as illustrated in FIG. 4.

The multiple section bobbin and multiple section coil reduces the capacitance around the coil. For example, with a three section coil, the capacitance is reduced as the square of the number of sections or to one-ninth of what it would be if a single coil of the same number of turns were utilized.

After the coils, capacitors and resistor have been mounted on the printed circuit board 12, the board and components are inserted into the cover 11 with the key slot 15 aligned with a projection on the cover. Then potting material 67 is inserted into the cover 11 through holes 61, 62, 63 and 64 to encapsulate the filter. The filter is received by a printed circuit board which has mating openings to receive pins 13, 14, 16, 17, 18 and 19.

FIG. 8 is an electrical schematic of the invention.

It is seen that this invention provides a novel filter and although it has been described with respect to preferred embodiments it is not to be so limited as changes and modifications may be made which are within the full intended scope as defined by the appended claims.

We claim as our invention:

1. An interference filter comprising a planar printed circuit board having first and second ends with a conductive area which provides a ground plane formed on a first surface thereof, a pair of spaced grounding pins connected to the circuit board in said conductive area which provides said ground plane, a pair of input pins and a pair of output pins mounted respectively in said printed circuit board at said first and second ends thereof, a first multisection coil connected between first ones of said pairs of input and output pins and mounted on a second surface opposite to said first surface and extends above said second surface of said printed circuit board, a second multisection coil connected between second ones of said pairs of input and output pins and mounted on said second surface and extends above said second surface of said printed circuit board, and a magnetic core coupling said first and second multisection coils and mounted on said second surface and extends above said second surface of said printed circuit board, a first capacitor connected between said pair of input pins and mounted on said second surface and extends above said second surface of said printed circuit board, and a second capacitor connected between said pair of output pins and mounted on said second surface and extends above said second surface of said printed circuit board, a resistor connected between said pair of input pins, a third capacitor mounted on said second surface and extends above said second surface of said printed circuit board and between a first one (13) of said pair of output pins and a first one (16) of said pair of spaced grounding pins, and a fourth capacitor mounted on said second surface and extends above said second surface of said printed circuit board and connected between a second one (14) of said pair of output pins and said first one (16) of said pair of spaced grounding pins, wherein said first multisection coil comprises a first multisection bobbin mounted on said second surface and extends above said second surface of said printed circuit board and formed with a central section at a center portion thereof which is formed with a rectangular opening and a plurality of partitions attached about and to said central section with coil sections of said first coil wound between adjoining partitions wherein said second multisection coil comprises a second multisection bobbin mounted on said second surface and extends above said second surface of said printed circuit board and formed with a central section at a center portion thereof which is formed with a rectangular opening and a plurality of partitions attached about and to said central section with coil sections of said second coil would between adjoining sections and said magnetic core being rectangular in cross-section and extending through the central sections of said first and second bobbins to magnetically couple said first and second coils together.

2. An interference filter comprising a planar printed circuit board having first and second ends with a conductive area which provides a ground plane formed on a first surface thereof, a pair of spaced grounding pins connected to the circuit board in said conductive area which provides said ground plane, a pair of input pins and a pair of output pins mounted respectively in said printed circuit board at said first and second ends thereof, a first multisection coil connected between first ones of said pairs of input and output pins and mounted on a second surface opposite said first surface and extends above said second surface of said printed circuit board, a second multisection coil connected between second ones of said pairs of input and output pins and mounted on said second surface and extends above said second surface of said printed circuit board, and a magnetic core coupling said first and second multisection coils and mounted on said second surface and extends above said second surface of said printed circuit board, a first capacitor connected between said pair of input pins and mounted on said second surface and extends above said second surface of said printed circuit board, and a second capacitor connected between said pair of output pins and mounted on said second surface and extends above said second surface of said printed circuit board, wherein said first multisection coil comprises a first multisection bobbin mounted on said second surface and extends above said second surface of said printed circuit board and formed with a central section at a center portion thereof which is formed with a rectangular opening and a plurality of partitions attached about and to said central section with coil sections of said first coil wound between adjoining partitions, wherein said second multisection coil comprises a second multisection bobbin mounted on said second surface and extends above said second surface of said printed circuit board and formed with a central section at a center portion thereof which is formed with a rectangular opening and a plurality of partitions attached about and to said central section with coil sections of said second coil wound between adjoining sections and said magnetic core being rectangular in cross-section and extending through the central sections of said first and second bobbins to magnetically couple said first and second coils together, wherein said magnetic core is formed of two U-shaped portions which are connected together end to end by adhesive to form a closed core.

3. An interference filter comprising a planar printed circuit board having first and second ends with a conductive area which provides a ground plane formed on a first surface thereof, a pair of spaced grounding pins connected to the circuit board in said conductive area which provides said ground plane, a pair of input pins and a pair of output pins mounted respectively in said printed circuit board at said first and second ends thereof, a first multisection coil connected between first ones of said pairs of input and output pins and mounted on a second surface opposite said first surface and extends above said second surface of said printed circuit board, a second multisection coil connected between second ones of said pairs of input and output pins, and mounted on said second surface and extends above said second surface of said printed circuit board, and a magnetic core coupling said first and second multisection coils and mounted on said second surface and extends above said second surface of said printed circuit board, a first capacitor connected between said pair of input pins and mounted on said second surface and extends above said second surface of said printed circuit board, and a second capacitor connected between said pair of output pins and mounted on said second surface and extends above said second surface of said printed circuit board, wherein said first multisection coil comprises a first multisection bobbin mounted on said second surface and extends above said second surface of said printed circuit board and formed with a central section at a center portion thereof which is formed with a rectangular opening and a plurality of partitions attached about and to said central section with coil sections of said first coil wound between adjoining partitions, wherein said second multisection coil comprises a second multisection bobbin mounted on said second surface and extends above said second surface of said printed circuit board and formed with a central section at a center portion thereof which is formed with a rectangular opening and a plurality of partitions attached about and to said central section with coil sections of said second coil wound between adjoining sections and said magnetic core being rectangular in cross-section and extending through the central sections of said first and second bobbins to magnetically couple said first and second coils together, and wherein said magnetic core is formed of a U-shaped portion and an I-shaped portion which are connected together by adhesive to form a closed core.

4. An interference filter comprising a planar printed circuit board having first and second ends with a conductive area which provides a ground plane formed on a first surface thereof, a pair of spaced grounding pins connected to the circuit board in said conductive area which provides said ground plane, a pair of input pins and a pair of output pins mounted respectively in said printed cricuit board at said first and second ends thereof, a first multisection coil connected between first ones of said pairs of input and output pins and mounted on a second surface opposite to said first surface and extends above said second surface of said printed circuit board, a second multisection coil connected between second ones of said pairs of input and output pins and mounted on said second surface and extends above said second surface of said printed circuit board, and a magnetic core coupling said first and second multisection coils and mounted on said second surface and extends above said second surface of said printed circuit board, a first capacitor connected between said pair of input pins and mounted on said second surface and extends above said second surface of said printed circuit board, and a second capacitor connected between said pair of output pins and mounted on said second surface and extends above said second surface of said printed circuit board, a resistor connected between said pair of input pins, a third capacitor mounted on said second surface and extends above said second surface of said printed circuit board and between a first one (13) of said pair of output pins and a first one (16) of said pair of spaced grounding pins, and a fourth capacitor mounted on said second surface and extends above said second surface of said printed circuit board and connected between a second one (14) of said pair of output pins and said first one (16) of said pair of spaced grounding pins, wherein said first multisection coil comprises a first multisection bobbin mounted on said second surface and extends above said second surface of said printed circuit board and formed with a central section at a center portion thereof which is formed with a rectangular opening and a plurality of partitions attached about and to said central section with coil sections of said first coil wound between adjoining partitions, wherein said second multisection coil comprises a second multisection bobbin mounted on said second surface and extends above said second surface of said printed circuit board and formed with a central section at a center portion thereof which is formed with a rectangular opening and a plurality of partitions attached about and to said central section with coil sections of said second coil wound between adjoining sections and said magnetic core being rectangular in cross-section and extending through the central sections of said first and second bobbins to magnetically couple said first and second coils together, including a hollow case made of insulative or conductive material into which said printed circuit board can be received to enclose said filter.

5. An interference filter according to claim 4 wherein said printed circuit board is formed with at least one hole formed anywhere on said printed circuit board and said case and filter are encapsulated with plastic material.

* * * * *